(12) United States Patent
Hirayama et al.

(10) Patent No.: US 8,821,683 B2
(45) Date of Patent: Sep. 2, 2014

(54) SUBSTRATE PROCESSING APPARATUS AND METHOD, AND PROGRAM AND STORAGE MEDIUM

(75) Inventors: Yusuke Hirayama, Nirasaki (JP); Kazuya Nagaseki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 2100 days.

(21) Appl. No.: 11/410,120

(22) Filed: Apr. 25, 2006

(65) Prior Publication Data
US 2006/0243389 A1 Nov. 2, 2006

Related U.S. Application Data

(60) Provisional application No. 60/682,013, filed on May 18, 2005.

(30) Foreign Application Priority Data

Apr. 28, 2005 (JP) ................ 2005-132588

(51) Int. Cl.
*H01L 21/306* (2006.01)
*C23C 16/00* (2006.01)
*H01J 37/32* (2006.01)
*H01L 21/3065* (2006.01)

(52) U.S. Cl.
CPC ......... *H01J 37/321* (2013.01); *H01L 21/3065* (2013.01); *H01J 37/32623* (2013.01)
USPC ................ 156/345.3; 118/723 R

(58) Field of Classification Search
CPC .............. H01J 37/32651; H01J 37/32642; H01J 37/32568; H01J 37/32623; H01J 37/32633; H01J 37/32082; H01J 37/32091; H01J 37/321; H01J 37/3211; H01J 37/32192; H01J 37/32137; H01J 37/32266; H01J 37/32275
USPC ............................ 118/720, 723 R; 156/345.3
See application file for complete search history.

(56) References Cited

U.S. PATENT DOCUMENTS

| | | | | |
|---|---|---|---|---|
| 5,248,371 A | * | 9/1993 | Maher et al. | 156/345.43 |
| 5,855,725 A | * | 1/1999 | Sakai | 156/345.49 |
| 6,101,970 A | * | 8/2000 | Koshimizu | 118/723 E |
| 6,132,805 A | * | 10/2000 | Moslehi | 427/248.1 |
| 6,284,668 B1 | * | 9/2001 | Imahashi | 438/716 |
| 6,851,384 B2 | * | 2/2005 | Yuda et al. | 118/723 ER |
| 2005/0051517 A1 | * | 3/2005 | Oehrlein et al. | 216/67 |

* cited by examiner

*Primary Examiner* — Luz Alejandro Mulero
(74) *Attorney, Agent, or Firm* — Rothwell, Figg, Ernst & Manbeck, P.C.

(57) ABSTRACT

A substrate processing apparatus includes a plasma source facing a substrate, and a shielding member placed between the substrate and the plasma source. The plasma source diffuses a plasma radially and the shielding member has a through hole through which a part of the radially diffused plasma passes. A substrate processing method is used for performing a plasma processing on a substrate in a substrate processing apparatus including a plasma source facing the substrate and a shielding member placed between the plasma source and the substrate. The shielding member has a through hole. The method includes the step of diffusing a plasma radially by the plasma source.

9 Claims, 7 Drawing Sheets

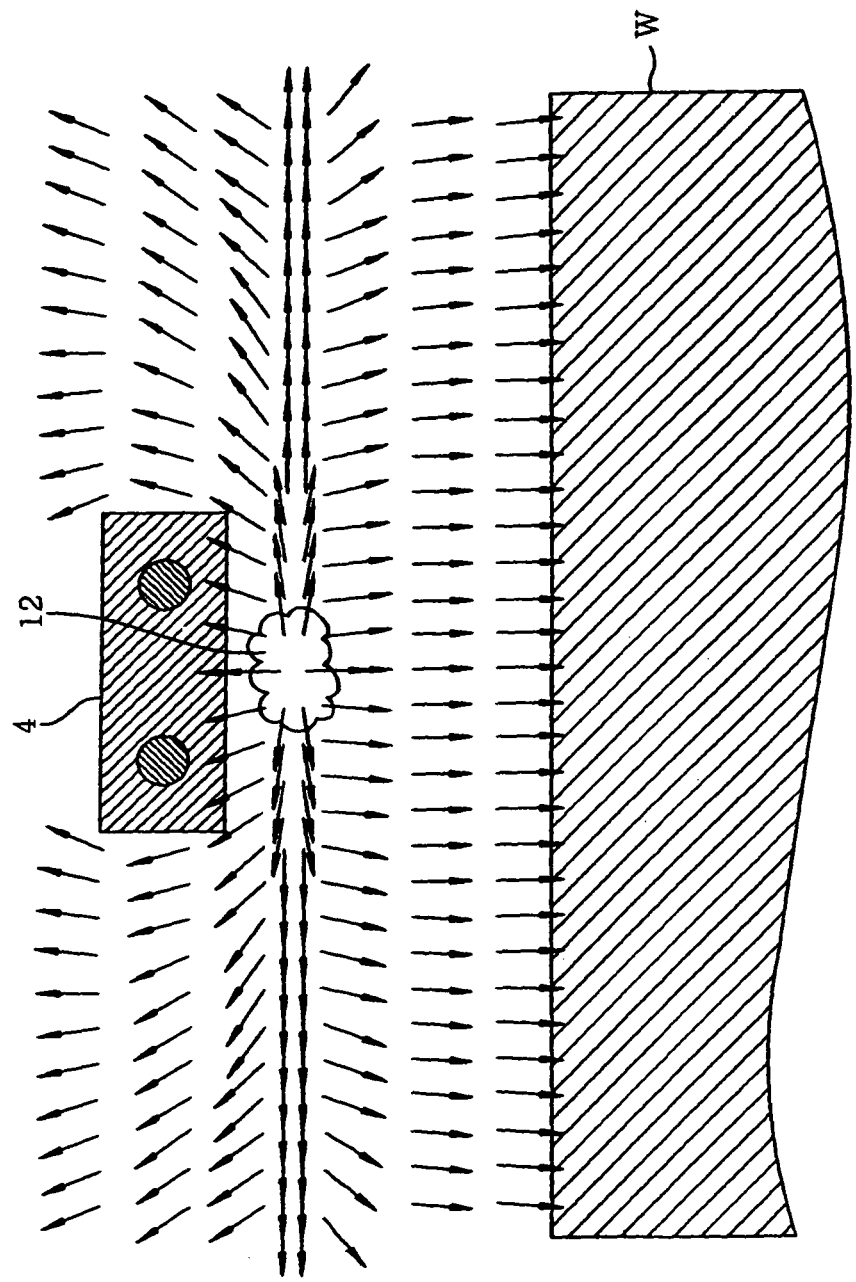

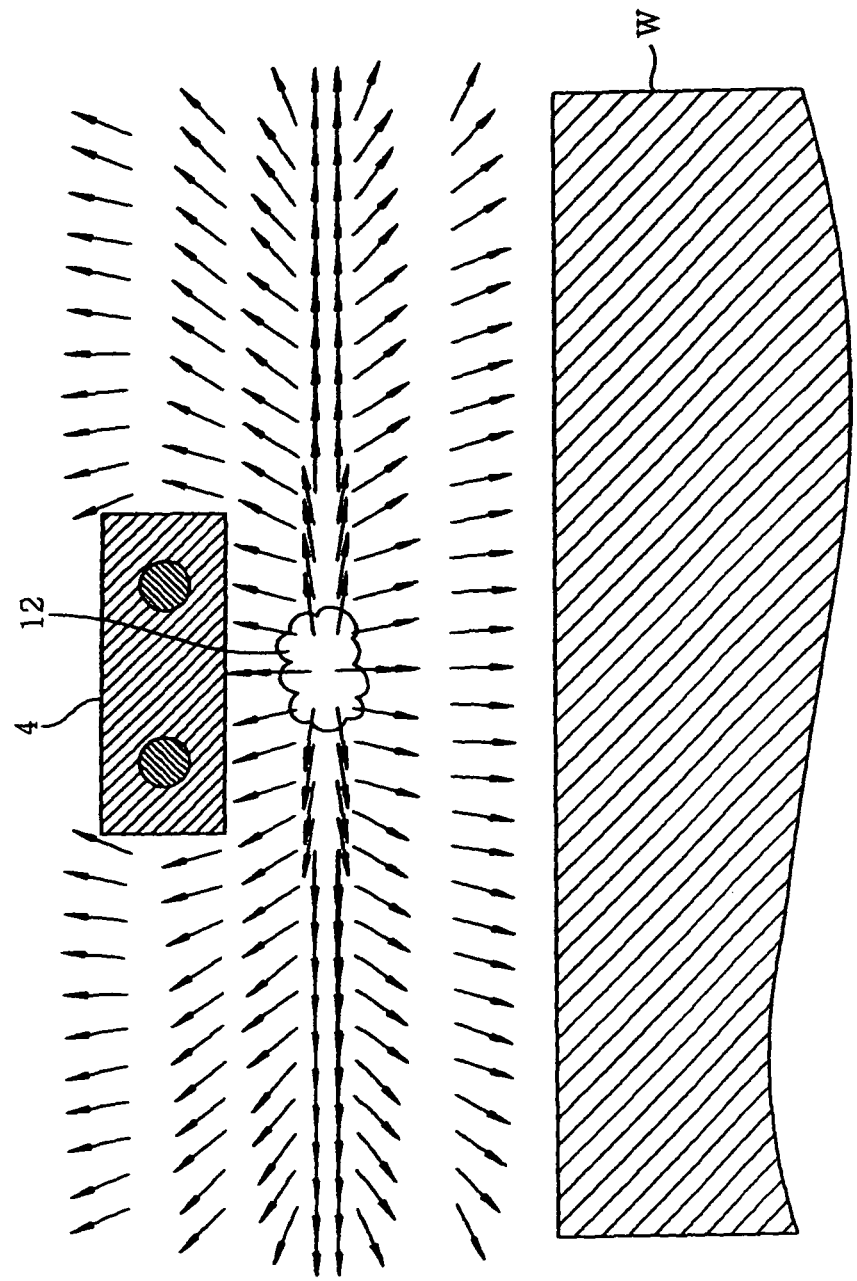

SUBSTRATE PROCESSING APPARATUS AND METHOD, AND PROGRAM AND STORAGE MEDIUM

FIELD OF THE INVENTION

The present invention relates to a substrate processing method, a substrate processing apparatus, a program and a computer readable storage medium containing the program.

BACKGROUND OF THE INVENTION

Conventionally, the RIE (Reactive Ion Etching), etching a surface of a wafer with ions, has been performed as a substrate processing that is performed on the wafer for a semiconductor device.

In the RIE processing, ions are generated by converting a processing gas that is introduced in a space facing the wafer into a plasma. The ions are accelerated by a self bias electric potential generated by applying RF power to a lower electrode, and the ions are collided with the surface of the wafer. Thus, the surface of the wafer is etched physically, thereby forming grooves (trenches) on the surface of the wafer. Since the accelerated ions proceed in a predetermined direction, the surface of the wafer is etched in the predetermined direction accordingly. Conventionally, in the RIE processing, trenches are formed vertical to the surface of the wafer.

Recently, miniaturization of integrated circuits formed by stacking semiconductor chips have been strongly demanded, and three-dimensional interconnections on the semiconductor chips have been strongly needed in order to increase stackability of the semiconductor chips. In other words, oblique etching (hereinafter, referred to as "angled etching") with respect to the surface of the wafer has been strongly required on the wafers which constitute bases of the semiconductor chips.

In addition, an ion injection method has been known that injects ions from an inclined direction in an ion implant process, which injects ions into a bottom portion of the trench. However, since the advancing direction of the injected ions is inclined with respect to the depth direction of the trench in this method, the ions are injected to a sidewall of the trench and the sidewall is degraded. Thus, in order to prevent the ions from being injected to the side wall of the trench, it is required that the trench is formed obliquely with respect to the surface of the wafer by the angled etching.

In response to such needs, as a means for realizing the angled etching, a plasma etching apparatus has been recently developed that includes a support unit supporting the wafer obliquely with respect to the advancing direction of the ions to etch the surface of the silicon obliquely (for example, see Japanese Patent Laid-open Publication No. S57-164986). In addition, a plasma surface processing apparatus has been developed that includes a dipole ring magnet capable of being tilted to apply a tilted magnetic field thereto so that the ions are introduced obliquely to the surface of the wafer (for example, see Japanese Patent Publication NO. H7-94475).

However, the above-described plasma etching apparatus or plasma surface processing apparatus is problematic in that an inclined angle of the support unit or the dipole ring magnet needs to be changed when an etching angle in the angled etching is set to a desired value, which makes setting of a desired etching angle difficult. In addition, since the configuration of the above-described plasma etching apparatus or plasma surface processing apparatus is complicated, there is a problem that costs of the apparatuses are increased.

SUMMARY OF THE INVENTION

It is, therefore, an object of the present invention to provide a substrate processing apparatus, substrate processing method, a program and a computer readable storage medium capable of easily setting a desired etching angle, at the same time, while the cost is saved.

To achieve the object, in accordance with a first aspect of the present invention, there is provided a substrate processing apparatus that includes a plasma source facing a substrate, including a shielding member placed between the substrate and the plasma source, wherein the plasma source diffuses a plasma radially and the shielding member has a through hole through which a part of the radially diffused plasma passes.

With this configuration, the apparatus includes the shielding member placed between the substrate and the plasma source. The plasma source diffuses the plasma radially, and the shielding member includes the through hole through which a part of the radially diffused plasma passes. Since the plasma passing through the through hole, among the whole diffused plasma, collides with a surface of the substrate at a predetermined angle, the surface of the substrate can be etched by simply placing the shielding member. Furthermore, since the diffusing direction of the plasma varies according to its location, the diffusing direction of the plasma passing through the through hole can be changed by simply changing the location of the through hole. Therefore, it is possible to set an etching angle easily and, at the same time, cost can be saved.

Preferably, in the above-described substrate processing apparatus, the through hole is opened at a region other than a region where a diffusing direction of the plasma is vertical to a surface of the substrate.

In accordance with the apparatus, since the through hole in the shielding member is opened at the region other than the region where the diffusing direction of the plasma is vertical to the surface of the substrate, the diffusing direction of ions passing through the through hole can be surely oblique to the surface of the substrate, thereby realizing the angled etching easily.

Preferably, in the above-described substrate processing apparatus, the plasma source and the shielding member move with respect to the substrate as a single unit.

In accordance with the apparatus, since the plasma source and the shielding member move as a single unit, the plasma with an identical diffusing direction can be introduced to a plurality of portions on the surface of the substrate, thereby forming multiple trenches each of which has an identical inclined angle at a plurality of portions on the surface of the substrate.

Preferably, in the above-described substrate processing apparatus, the shielding member moves while changing a relative location thereof with respect to the plasma source.

In accordance with the apparatus, since the shielding member moves while changing its relative location with respect to the plasma source, the plasma with distinct diffusing directions can be introduced to a plurality of portions on the surface of the substrate. Therefore, it is possible to form multiple trenches each of which has a distinct inclined angle at a plurality of portions on the surface of the substrate.

Preferably, in the above-described substrate processing apparatus, the plasma source moves while changing a relative location thereof with respect to the shielding member.

In accordance with the apparatus, since the plasma source moves while changing its relative location with respect to the plasma source, when the plasma is introduced to a certain portion on the surface of the substrate, the diffusing direction of the plasma being introduced thereto can be changed during the diffusion. Therefore, it is possible to form a trench whose inclined angle varies in the middle thereof along its depth direction.

Preferably, in the above-described substrate processing apparatus, the shielding member is electrically floated.

In accordance with the apparatus, since the shielding member is electrically floated, the diffusing direction of the plasma passing through the through hole can be prevented from being scattered, thereby setting surely a desired etching angle.

Preferably, in the above-described substrate processing apparatus, the shielding member is a conductor.

In accordance with the apparatus, since the shielding member is a conductor, even in case the shielding member is electrically charged, the electric charges can be removed easily by grounding the shielding member, thereby setting surely a desired etching angle.

Preferably, the substrate processing apparatus further includes a mounting table mounting the substrate, wherein a low power is applied to the mounting table.

In accordance with the apparatus, since the apparatus includes the mounting table mounting the substrate and a low power is applied to the mounting table, a DC bias generated in the mounting table conveys the plasma towards the substrate. Also, since the DC bias is a low voltage due to the low power, the diffusing direction of the plasma passing through the through hole can be prevented from being scattered, thereby setting surely a desired etching angle.

In accordance with another aspect of the present invention, there is provided a substrate processing method for performing plasma processing on a substrate in a substrate processing apparatus that includes a plasma source facing the substrate and a shielding member placed between the plasma source and the substrate, the shielding member having a through hole. The method includes the step of diffusing a plasma radially by the plasma source.

With this configuration, the plasma source diffuses the plasma radially in the substrate processing apparatus including the plasma source facing the substrate and the shielding member placed between the plasma source and the substrate. Furthermore, the shielding member includes the through hole therein.

In the configuration, since a part of the radially diffused plasma passes through the through hole and the plasma passing through the through hole collides with the surface of the substrate at a predetermined angle, the surface of the substrate can be etched at a predetermined angle by simply placing the shielding member. Also, since the diffusing direction of the plasma varies according to its location, the diffusing direction of the plasma can be changed by simply changing the location of the through hole in the shielding plate. Therefore, it is possible to set easily a desired etching angle and at the same time, cost can be saved.

Preferably, in the substrate processing method, the method further includes the step of moving the plasma source and the shielding member with respect to the substrate as a single unit.

In accordance with the method, since the plasma source and the shielding member move as a single unit, the plasma with an identical diffusing direction can be introduced to a plurality of portions on the surface of the substrate, thereby forming multiple trenches each of which has an identical inclined angle at the plurality of portions on the surface of the substrate.

Preferably, in the substrate processing method, the method further includes the step of moving the shielding member while changing a relative location thereof with respect to the plasma source.

In accordance with the method, since the shielding member moves while changing its relative location with respect to the plasma source, the plasma with distinct diffusing directions can be introduced to a plurality of portions on the surface of the substrate. Therefore, it is possible to form multiple trenches each of which has a distinct inclined angle at a plurality of portions on the surface of the substrate.

Preferably, in the substrate processing method, the method further includes the step of moving the plasma source while changing a relative location thereof with respect to the shielding member.

In accordance with the method, since the plasma source moves while changing its relative location with respect to the plasma source, when a plasma is introduced to a certain portion on the surface of the substrate, the diffusing direction of the plasma being introduced thereto can be changed during the diffusion. Therefore, it is possible to form a trench whose inclined angle varies in the middle thereof along its depth direction.

In accordance with still another aspect of the present invention, there is provided a computer executable program for performing a substrate processing method which performs a plasma processing on a substrate in a substrate processing apparatus including a plasma source facing the substrate and a shielding member placed between the plasma source and the substrate, the shielding member having a through hole, the program including a plasma diffusing module for diffusing a plasma radially by the plasma source; and a plasma source moving module for moving the plasma source and the shielding member with respect to the substrate as a single unit.

With this configuration, the plasma source diffuses the plasma radially in the substrate processing apparatus including the plasma source facing the substrate and the shielding member placed between the plasma source and the substrate. Furthermore, the shielding member has the through hole therein. In the configuration, since a part of the radially diffused plasma passes through the through hole and the plasma passing through the through hole collides with a surface of the substrate at a predetermined angle, the surface of the substrate can be etched at a predetermined angle by simply placing the shielding member. Also, since the diffusing direction of the plasma varies according to its location, the diffusing direction of the plasma can be changed by simply changing the location of the through hole. Therefore, a desired etching angle can be set easily and cost can be saved.

Furthermore, since the plasma source and the shielding member move as a single unit, the plasma with an identical diffusing direction can be introduced to a plurality of portions on the surface of the substrate. Therefore, it is possible to form multiple trenches each of which has an identical inclined angle at a plurality of portions on the surface of the substrate.

In accordance with still another aspect of the present invention, there is provided a computer executable program for performing a substrate processing method which performs a plasma processing on a substrate in a substrate processing apparatus including a plasma source facing the substrate and a shielding member placed between the plasma source and the substrate, the shielding member having through holes, the program including a plasma diffusing module for diffusing the plasma radially by the plasma source; and a shielding member moving module for moving the shielding member while changing a relative location thereof with respect to the plasma source.

With this configuration, the plasma source diffuses the plasma radially in a substrate processing apparatus including the plasma source facing the substrate, and the shielding member placed between the plasma source and the substrate. The shielding member has the through hole therein. In the configuration, since a part of the radially diffused plasma passes through the through hole and the plasma having passed through the through hole collides with a surface of the substrate at a predetermined angle, the surface of the substrate can be etched at a predetermined angle by simply placing the shielding member. Also, the diffusing direction of the plasma can be changed by simply changing the location of the through hole. Therefore, a desired etching angle can be set easily and cost can be saved.

Moreover, since the shielding member moves while changing its relative location with respect to the plasma source, the plasma with distinct diffusing directions is introduced to a plurality of portions on the surface of the substrate, thereby forming multiple trenches each of which has a distinct inclined angle at a plurality of portions on the surface of the substrate.

In accordance with still another aspect of the present invention, there is provided a computer readable storage medium storing a computer executable program for performing a substrate processing method which performs a plasma processing on a substrate in a substrate processing apparatus including a plasma source facing a substrate and a shielding member placed between the plasma source and the substrate, the shielding member having through holes, the program including a plasma diffusing module for diffusing the plasma radially by the plasma source; and a plasma source moving module for moving the plasma source and the shielding member with respect to the substrate as a single unit.

With this configuration, the plasma source diffuses a plasma radially in the substrate processing apparatus including the plasma source facing the substrate and the shielding member placed between the plasma source and the substrate. The shielding member has a through hole therein. In this configuration, since a part of the radially diffused plasma passes through the through hole and the plasma passing through the through hole collides with the surface of the substrate at a predetermined angle, the surface of the substrate can be made etched at a predetermined angle by simply placing the shielding member. Also, the diffusing direction of the plasma can be changed by simply changing the location of the through hole. Therefore, a desired etching angle can be set easily and cost can be saved.

Also, since the plasma source and the shielding member move as a single unit, the plasma with an identical diffusing direction can be introduced to a plurality of portions on the surface of the substrate, thereby forming multiple trenches each of which has an identical inclined angle at a plurality of portions on the surface of the substrate.

In accordance with still another aspect of the present invention, there is provided a computer readable storage medium storing a computer executable program for performing a substrate processing method which performs a plasma processing on a substrate in a substrate processing apparatus including a plasma source facing a substrate and a shielding member placed between the plasma source and the substrate, the shielding member having through holes, the program including a plasma diffusing module for diffusing the plasma radially by the plasma source; and a shielding member moving module for moving the shielding member while changing a relative location of the shielding member with respect to the plasma source.

With this configuration, the plasma source diffuses the plasma radially in the substrate processing apparatus including the plasma source facing the substrate and the shielding member placed between the plasma source and the substrate. In addition, the shielding member has the through hole therein. Since a part of the radially diffused plasma passes through the through hole and the plasma passing through the through hole collides with a surface of the substrate at a predetermined angle, the surface of the substrate can be etched at the predetermined angle by simply placing the shielding member.

Also, since the diffusing direction of the plasma varies according to its location, the diffusing direction of the plasma can be changed by simply changing the location of the through hole. Therefore, a desired etching angle can be set easily and cost can be saved. Furthermore, since the shielding member moves while changing its relative location with respect to the plasma source, the plasma with distinct diffusing directions is introduced to a plurality of portions on the surface of the substrate, thereby forming multiple trenches each of which has a distinct inclined angle at a plurality of portions on the surface of the substrate.

BRIEF DESCRIPTION OF THE DRAWINGS

The above and other objects and features of the present invention will become apparent from the following description of preferred embodiments given in conjunction with the accompanying drawings, in which:

FIG. 2 illustrates a simulation result of a velocity distribution of ions generated from a chlorine gas by an ICP source of FIGS. 1A and 1B;

FIG. 3 depicts a simulation result of a velocity distribution of ions generated from an argon gas by the ICP source of FIGS. 1A and 1B;

DETAILED DESCRIPTION OF THE PREFERRED EMBODIMENT

Hereinafter, preferred embodiments of the present invention will be described with reference to the drawings.

First, a substrate processing apparatus in accordance with a first preferred embodiment of the present invention will be described.

Figure 1A:
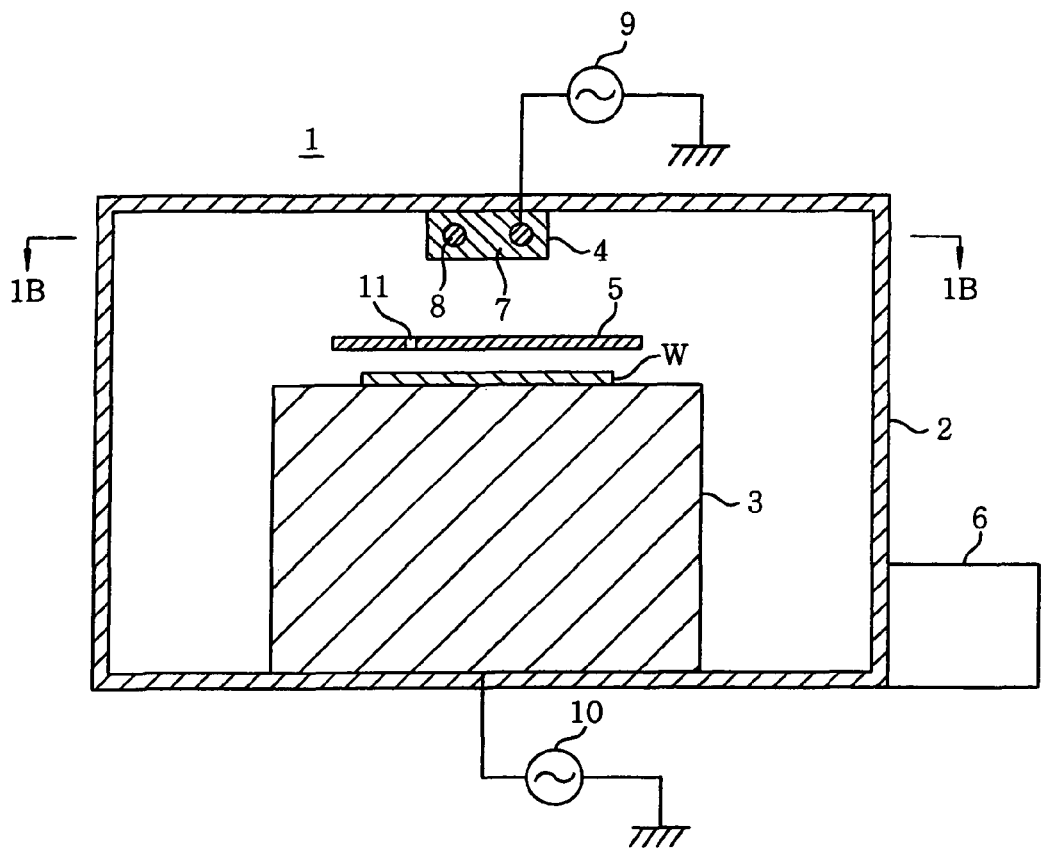
FIGS. 1A and 1B show schematic views of an etching processing apparatus as a substrate processing apparatus in accordance with a first preferred embodiment, wherein FIG. 1A describes a cross sectional view of the etching processing apparatus and FIG. 1B provides a cross sectional view of the etching processing apparatus taken along the line 1B-1B of FIG. 1A.
Figure 1B:
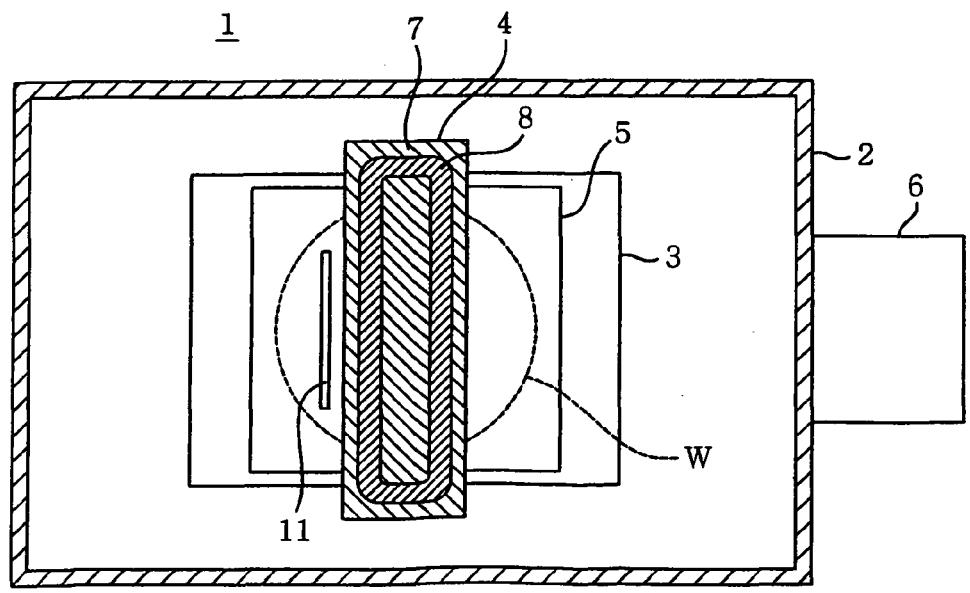

FIGS. 1A and 1B show schematic views of an etching processing apparatus as a substrate processing apparatus in accordance with the first preferred embodiment. FIG. 1A shows a cross sectional view of the etching processing apparatus 1, and FIG. 1B provides a cross sectional view of the etching processing apparatus 1 taken along the line 1B-1B in FIG. 1A.

In FIGS. 1A and 1B, the etching apparatus 1 includes a vacuum processing chamber 2 receiving a wafer (substrate) W used for a semiconductor device, a mounting table 3 placed in the vacuum processing chamber 2 for mounting the wafer W, and an ICP (Inductively Coupled Plasma) source (a plasma source) 4 placed in the vacuum processing chamber 2 so as to face the wafer W mounted on the mounting table 3. In addition, the apparatus 1 includes a shielding plate (a shielding member) 5 placed between the wafer W and the ICP source 4, a TMP (Turbo Molecular Pump) 6 connected to the vacuum processing chamber 2 and a processing gas supply unit (not shown) for supplying a processing gas into the vacuum processing chamber 2.

The ICP source 4 includes a rectangular solid-shaped insulator 7, a single-loop coil 8 placed in the insulator 7 and a first RF power supply 9 connected to the coil 8. The first RF power supply 9 applies RF power to the coil 8. In addition, an induced electric field is generated by a current flowing through the coil 8. Therefore, the processing gas supplied into the vacuum chamber 2 is converted into a plasma in the induced electric field, thereby generating ions. In this preferred embodiment, in order to stabilize the discharge and increase the density of the ions, the ICP source 4 is placed about 40 mm above the wafer W in FIG. 1A.

The mounting table 3 is connected to a second RF power supply 10. The second RF power supply 10 applies RF power, e.g., low power of 13.56 MHz, to the mounting table 3. A DC bias generated in the mounting table 3 to which the power is applied conveys the ions generated by the ICP source 4 towards the wafer W mounted on the mounting table 3.

FIG. 2 illustrates a simulation result of a velocity distribution of ions generated from a chlorine ($Cl_2$) gas by the ICP source of FIGS. 1A and 1B, and FIG. 3 depicts a simulation result of a velocity distribution of ions generated from an argon (Ar) gas by the ICP source of FIGS. 1A and 1B. Also, in both drawings, the shielding plate 5 is omitted for an explanation purpose, and dimensional and locational relationship of the ICP source 4 and the wafer W are different from those in FIGS. 1A and 1B.

As shown in FIG. 2 and FIG. 3, the ions are generated at an ion-generating region 12 right below the ICP source 4 and diffused approximately radially from the ion-generating region 12. However, since the ions collide with radicals, the ions are not diffused uniformly and the diffusing directions of the ions vary as the ions get distant from the ICP source 4. Specifically, ions at approximately the same height of the ion-generating region 12 with respect to a surface of the wafer W (hereinafter, referred to as "wafer surface") are diffused approximately parallel to the surface of the wafer W.

However, the ions are diffused toward an approximately vertical direction to the wafer surface as ions get closer from the ion-generating region 12 to the wafer surface. Also, almost all ions are diffused in a vertical direction to the wafer surface near the wafer surface. To be more precise, an angle between the diffusing direction of the ions and the direction vertical to the wafer surface gets larger near the wafer surface as the ion gets distant from the ICP source. In other words, the diffusing directions of the ions vary according to the locations thereof.

Furthermore, the ions right below the ion-generating region 12 are diffused vertical to the wafer surface irrespective of the height from the wafer surface.

Moreover, as can be known from the comparison of FIG. 2 and FIG. 3, the diffusing directions of the ions vary according to gas species.

Referring back to the FIGS. 1A and 1B, the shielding plate 5 consists of a rectangular plate-shaped conductor which is electrically floated. The shielding plate 5 has a slit-shaped through hole 11 penetrating the shielding plate 5. Interconnections and switches (not shown) are connected to the shielding plate 5 which enable the shielding plate 5 to be grounded at desired timings.

Furthermore, the shielding plate 5 is placed apart from the wafer W by 10 mm to 20 mm, and is in parallel to and facing the wafer W. The through hole 11 of the shielding plate 5 is opened at a region other than a region right below the ion-generating region 12 (right below the ICP source 4 in FIG. 1A). In other words, the through hole 11 is opened at a region not overlapping with the ICP source 4 as shown in FIG. 1B in a plane view. Moreover, a plurality of through holes, rather than a single through hole, may be opened in the shielding plate 5. In addition, the material consisting of the shielding plate 5 is not limited to conductors and it may be an insulator.

The TMP 6 evacuates the vacuum processing chamber 2 to decrease pressure to a predetermined value in the angled etching processing which will be described below.

Furthermore, the operations of each element in the above-described etching processing apparatus 1 are controlled by a controller connected to the etching processing apparatus 1, e.g., a computer (not shown).

Thereafter, angled etching performed by the etching processing apparatus 1 of FIGS. 1A and 1B will be described.

Figure 4:
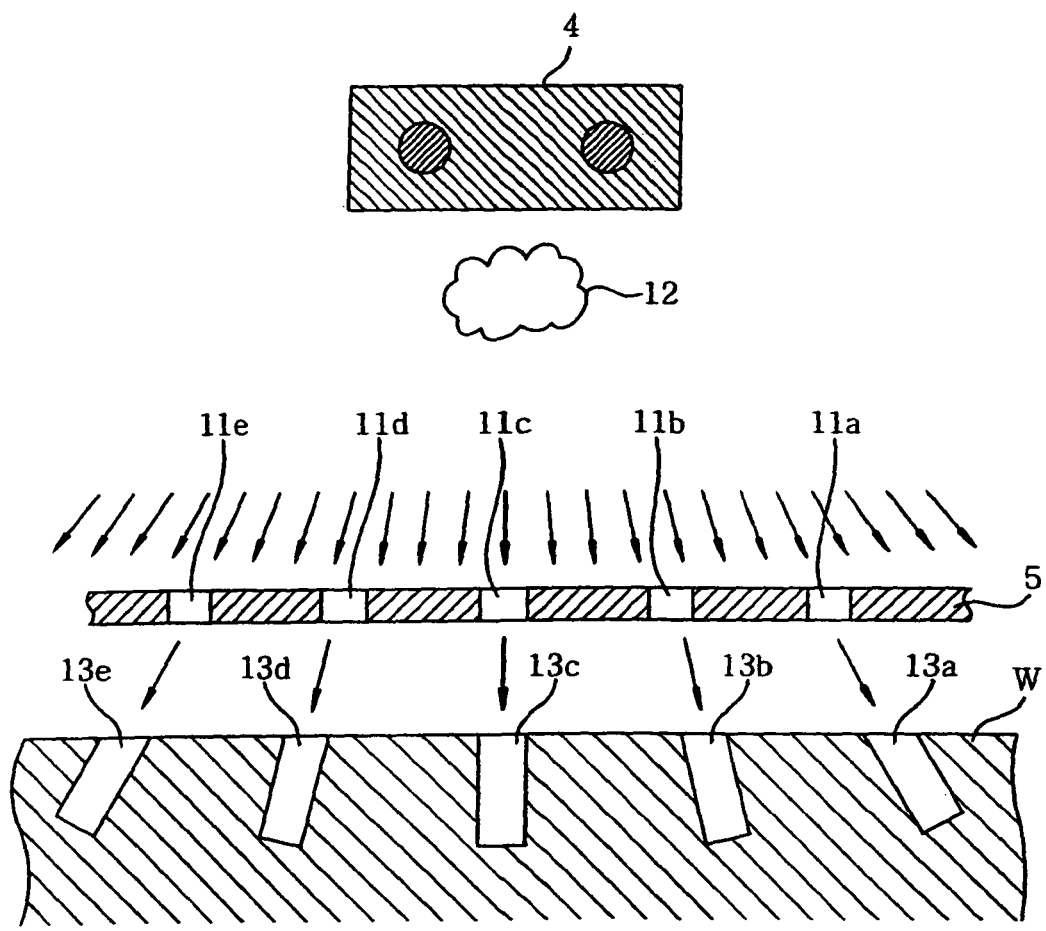
FIG. 4 is a drawing explaining a principal of angled etching performed by the etching processing apparatus of FIGS. 1A and 1B.

FIG. 4 is a drawing explaining a principal of angled etching performed by the etching processing apparatus of FIGS. 1A and 1B. Also, in FIG. 4, dimensional and locational relationship of the ICP source 4, shielding plate 5 and wafer W are different from those of FIGS. 1A and 1B for an explanation purpose.

As described above, the diffusing directions of the ions vary near the wafer surface as the ions get distant from the ICP source 4. Accordingly, in case that the shielding plate 5 is placed near the wafer surface between the wafer W and the ICP source 4, the diffusing directions of the ions vary near the surface of the shielding plate 5 as the ions get distant from the ICP source 4.

As shown in FIG. 4, a through hole 11c right below the ICP source 4 and two through holes (through hole 11b and through 11d) at a predetermined distance from the through hole 11c in a direction away from the IPC source 4 are formed in the shielding plate 5. In addition, a through hole 11a at a predetermined distance from the through hole 11b in the direction away from the IPC source 4 and a through hole 11e at a predetermined distance from the through hole 11d in the direction away from the ICP source 4 are formed therein.

In accordance with the preferred embodiment, a part of the ions diffused by the ICP source 4 pass through each through hole (through holes 11a to 11e). As described above, since the diffusing directions of the ions vary as the ions get distant from the ICP source 4, the diffusing directions of the ions passing through each through hole (through holes 11a to 11e) are different from one other. In addition, since the through hole 11c is opened right below the ICP source 4, the ions passing through the through hole 11c are diffused vertical to the wafer surface at a region right below the ICP source 4 (right below the ion-generating region 12) as described above.

To be more precise, in the order of the through holes 11c to 11e, the angle between each diffusing direction of the ions passing through each through hole and the direction vertical to the wafer surface gets larger. Thus, since the ions passing through each through hole collide with the wafer surface to etch the surface along the diffusing direction, the ions passing through the through holes 11d and 11e etch the wafer surface obliquely. In addition, the inclined angle of a trench 13e (an angle between a depth direction of the trench and the direction vertical to the wafer surface) formed by the ions passing through the through hole 11e is larger than that of a trench 13d formed by the ions passing through the through hole 11d.

Furthermore, in the same manner, in the order of the through holes 11c to 11a, the angle between each diffusing direction of the ions passing through each through hole and the direction vertical to the wafer surface gets larger. Therefore, the ions passing through the through holes 11b and 11a collide with the wafer surface to etch the surface obliquely. Also, the inclined angle of a trench 13a formed by the ions passing through the through hole 11a is larger than that of a trench 13b formed by the ions passing through the through hole 11b.

Moreover, the inclined angle of a trench 13c formed by the ions passing through the through hole 11c is vertical to the wafer surface.

Thus, etching the wafer surface obliquely in the etching processing apparatus 1 can be accomplished by forming the through holes other than the through hole 11c in the shielding plate 5. In accordance with this, in the etching processing apparatus 1 of FIGS. 1A and 1B, the angled etching is accomplished by opening the through hole 11 in the shielding plate 5 at the region other than the region right below the ICP source 4 (right below the ion-generating region 12).

Hereinafter, the angled etching processing performed by the etching processing apparatus 1 will be described. This etching processing is performed by a computer connected to the etching processing apparatus 1 according to a program corresponding to the etching processing.

First, the wafer W to be etched is loaded in the vacuum processing chamber 2 by a transfer arm (not shown) and the wafer W is mounted on the mounting table 3.

Subsequently, the TMP 6 reduces pressure in the vacuum processing chamber 2 to a predetermined value and the shielding plate 5 is placed between the wafer W and the ICP source 4. The through hole 11 thereof is opened at the region other than the region right below the ICP source 4. In other words, the through hole 11 is placed in order to be opened at the region other than the region vertical to the wafer W.

Subsequently, the processing gas, e.g., consisting of one or combination of silicon tetrafluoride ($SiF_4$), oxygen ($O_2$), argon (Ar) and carbon tetrafluoride ($CF_4$) is supplied from a process gas supply unit into the vacuum processing chamber 2. In addition, RF power is applied from the first RF power supply 9 to the coil 8 of the ICP source 4 and the processing gas near the ICP source 4 is converted into the plasma by the ICP source 4, thereby generating ions. The ions are diffused, a part of the ions pass through the through hole 11 and, in addition, the ions reach the wafer surface. The ions reaching the wafer surface etch the wafer surface along the diffusing direction.

Thereafter, when the depth of the trench formed by the etching comes up to a predetermined depth, an application of RF power to the coil 8 and mounting table 3 is stopped and the present processing is completed.

In addition, in the above-described angled etching processing, after the wafer w is mounted on the mounting table 3, the shielding plate 5 is placed between the wafer W and the ICP source 4. However, the shielding plate 5 may be placed between the wafer W and ICP source 4 from an initial stage.

When the present inventor performed the angled etching using a chlorine gas as the processing gas, the inclined angle of the trench formed at a region offset by 20 mm from the ICP source 4 right below the ICP source 4 was about 8.0 degree. This result conformed well to the angle (about 10 degree) between the diffusing direction of the ions at the same region and the direction vertical to the wafer surface in the simulation of the velocity distribution of ions generated from the chlorine gas in FIG. 2.

In accordance with the substrate processing apparatus of the preferred embodiment, the apparatus includes the shielding plate 5 placed between the wafer W and the ICP source 4. The ICP source 4 diffuses the ions, and the shielding plate 5 has the through hole 11 opened at the region other than the region (the ion-generating region 12) right below the ICP source 4.

Since the ions passing through the through hole 11, among the whole ions diffused from the ICP source 4, collide with the wafer surface to etch the surface along the diffusing direction of the ions, the wafer surface can be etched obliquely along the diffusing direction of the ions by simply placing the shielding plate 5. In addition, the diffusing directions of the ions vary near the shielding plate 5 as the ions get distant from the ICP source 4. Therefore, the etching angle can be changed by simply changing the location of the through hole 11 to change the diffusing direction of the ions passing therethrough. Thus, a desired etching angle can be set easily and, at the same time, cost can be saved.

Moreover, since the through hole 11 is opened at the region other than the region right below the ICP source 4, the diffusing direction of the ions passing through the through hole 11 can surely be made oblique to the wafer surface, thereby realizing easily the angled etching.

Furthermore, since the shielding plate 5 consists of a conductor which is electrically floated, the diffusing direction of the ions passing through the through hole 11 can be prevented from being scattered. Also, even in case the shielding plate 5 is electrically charged, the electric charges can be removed easily by grounding the shielding plate 5, thereby setting surely a desired etching angle.

Moreover, although RF power having low power is applied to the mounting table 3, the DC bias generated by the power is low voltage due to the low power. Therefore, the diffusing direction of the ions passing through the through hole 11 can be prevented from being scattered due to the existence of the DC bias and setting surely a desired etching angle can be achieved. Accordingly, the above-described etching processing apparatus 1 is appropriate for the angled etching of a poly-silicon layer, and halogen gases, i.e., fluorine, chlorine and bromine other than the above-described processing gas are desirable as the processing gas.

Hereinafter, a substrate processing apparatus in accordance with a second preferred embodiment of the present invention will be described.

The second preferred embodiment has basically the same configuration and operation as the above-described first preferred embodiment, except that the ICP source 4 and the shielding plate 5 move parallel to the wafer W as a single unit. Therefore, the explanation of the configuration of the substrate processing apparatus will be omitted herein, and operations different from the first preferred embodiment will be explained below.

Figure 5A:
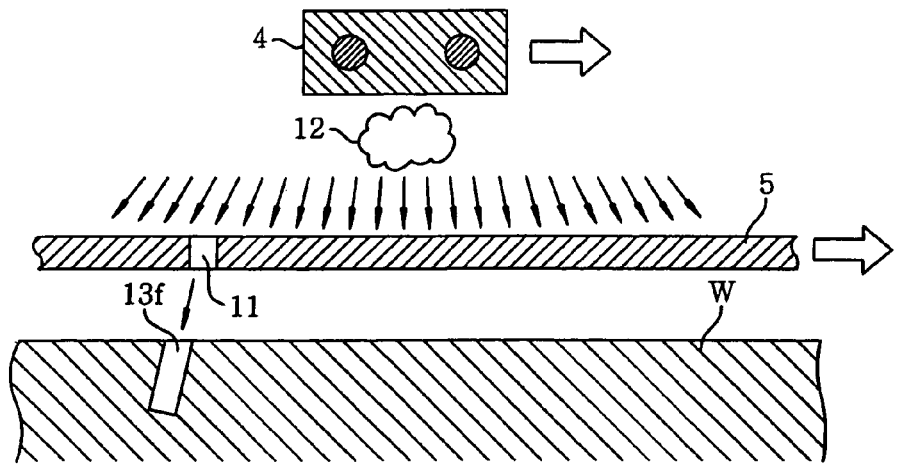
FIGS. 5A to 5C offer process charts of the angled etching processing performed by the etching processing apparatus as a substrate processing apparatus in accordance with a second preferred embodiment.
Figure 5B:
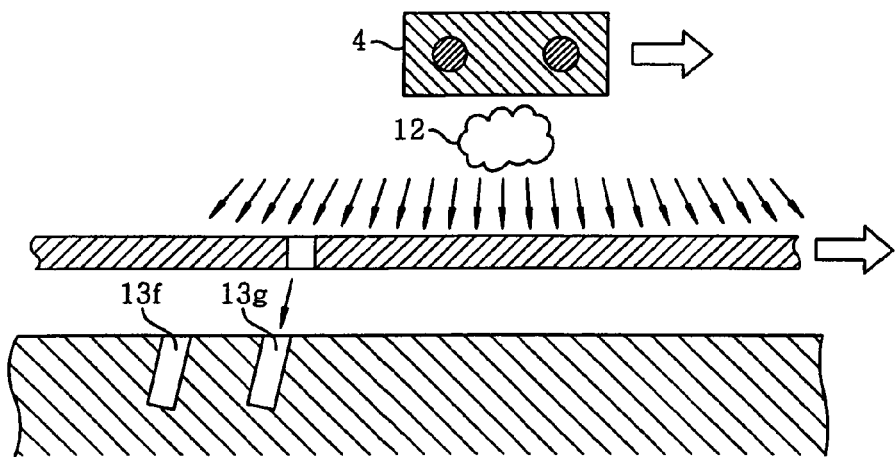
Figure 5C:
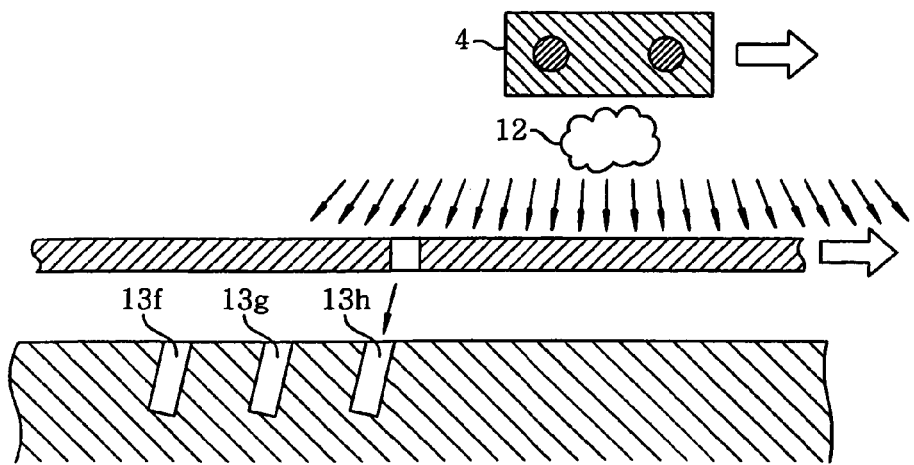

FIGS. 5A to 5C offer process charts of the angled etching processing performed by the etching processing apparatus as a substrate processing apparatus in accordance with the second preferred embodiment. This angled etching processing is also performed by the computer connected to the etching processing apparatus 1 according to a program corresponding to the etching processing.

In FIGS. 5A to 5C, first, after the wafer W is loaded in the vacuum processing chamber 2 and mounted on the mounting table 3, the ICP source 4 and the shielding plate 5 move parallel to the wafer W as a single unit, and the through hole 11 in the shielding plate 5 is set to face a first desired location (a first location where the angled etching is to be performed on the wafer surface).

Subsequently, the processing gas is supplied from the processing gas supply unit into the vacuum processing chamber 2 and RF power is applied to the coil 8 and the mounting table 3. Then, the processing gas near the ICP source 4 is converted into the plasma by the ICP source 4, thereby generating the ions. The ions are diffused, and a part of the ions pass through the through holes 11 in the shielding plate 5 to reach the first desired location on the wafer surface. The ions etch the wafer surface along their diffusing direction, and a trench 13*f* whose inclined angle conforms to the diffusing direction thereof is formed at the first desired location (FIG. 5A).

Thereafter, when the depth of the trench 13*f* comes up to a predetermined depth, the application of RF power to the coil 8 and mounting table 3 is stopped. Then, the ICP source 4 and the shielding plate 5 move parallel to the wafer W as a single unit, and the through hole 11 in the shielding plate 5 is set to face a second desired location (a location where the angled etching is to be performed subsequently) on the wafer surface.

Subsequently, a trench 13*g* whose inclined angle conforms to the diffusing direction of the ions is formed at the second desired location by supplying the same processing gas as described above and generating the ions. In this case, the inclined angle of the trench 13*g* is the same as that of the trench 13*f* (FIG. 5B) since the relative location between the ICP source 4 (the ion-generating region 12) and the through hole 11 in the shielding plate 5 is the same as that while forming the trench 13*f*.

Thereafter, when the depth of the trench 13*g* comes up to the predetermined depth, the application of RF power to the coil 8 and mounting table 3 is stopped. Then, the ICP source 4 and the shielding plate 5 move parallel to the wafer W as a single unit, and the through hole 11 in the shielding plate 5 is set to face a third desired location (again, a location where the angled etching is to be performed subsequently) on the wafer surface.

Subsequently, a trench 13*h* whose inclined angle conforms to the diffusing direction of the ions is formed at the third desired location by supplying the same processing gas as described above and generating the ions. This inclined angle of the trench 13*h* is the same as that of the trench 13*f* (FIG. 5C).

Thereafter, the present process is completed when a desired number of trenches are formed by repeating the same operations.

In accordance with the angled etching processing of FIGS. 5A to 5C, since the ICP source 4 and the shielding plate 5 move parallel to the wafer surface as a single unit, the ions with an identical diffusing direction can reach a plurality of portions (the first desired location, the second desired location and the third desired location) on the wafer surface, thereby forming the trenches 13*f*, 13*g* and 13*h* each of which has an identical inclined angle at the plurality of portions of the wafer surface.

Furthermore, in the substrate processing apparatus in accordance with the preferred embodiment, the distance between the adjacent trenches can be changed easily by simply controlling the moving distance of the ICP source 4 and the shielding plate 5.

Hereinafter, the substrate processing apparatus in accordance with a third preferred embodiment will be explained.

The third preferred embodiment has basically the same configuration and operations of the above-described first preferred embodiment, except that the shielding plate 5 moves while changing its relative location with respect to the ICP source 4. Therefore, the explanation of the configuration of the substrate processing apparatus will be omitted herein, and operations different from the first preferred embodiment will be explained below.

Figure 6A:
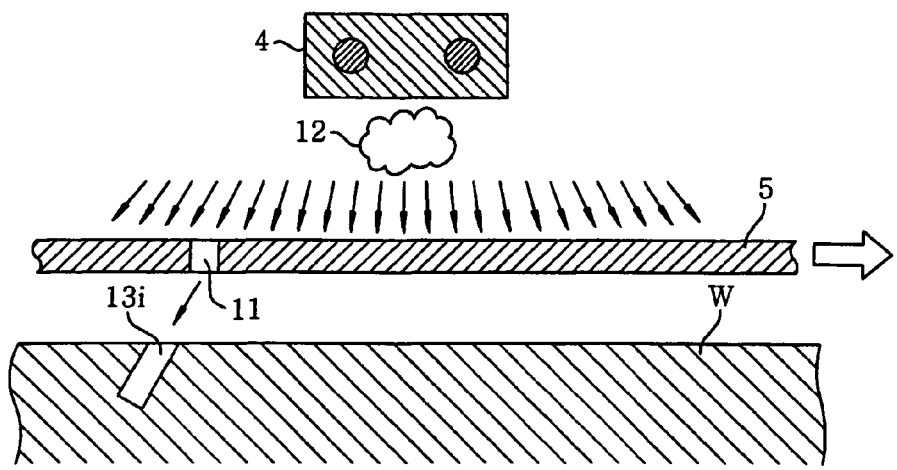
FIGS. 6A to 6C provide process charts of the angled etching processing performed by the etching processing apparatus as a substrate processing apparatus in accordance with a third preferred embodiment.
Figure 6B:
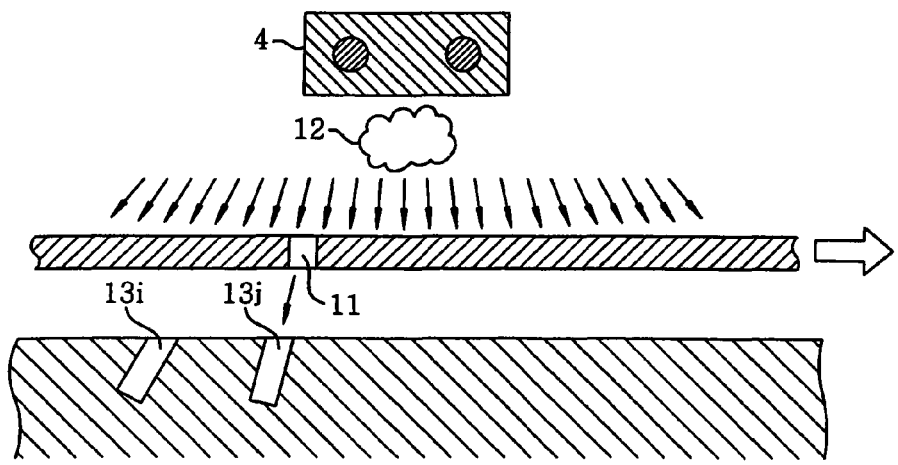
Figure 6C:
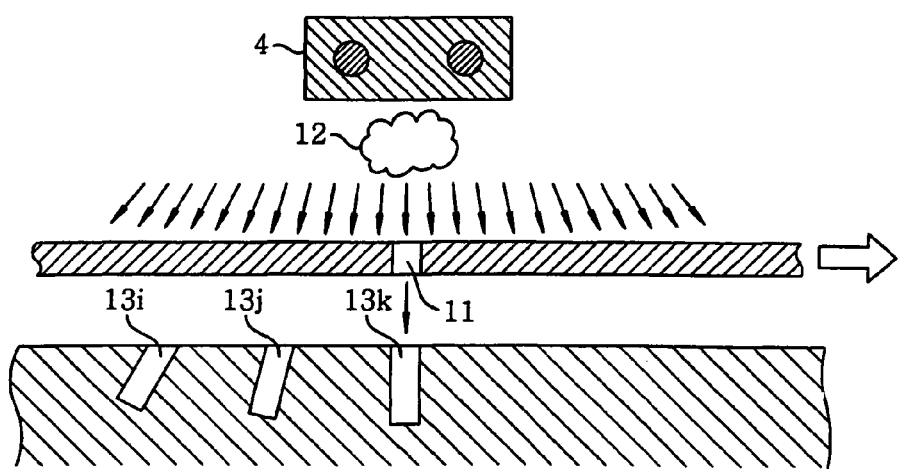

FIGS. 6A to 6C provide process charts of the angled etching processing performed by the etching processing apparatus as the substrate processing apparatus in accordance with the third preferred embodiment. This etching processing is also performed by the computer connected to the etching processing apparatus 1 according to a program corresponding to the etching processing.

In FIGS. 6A to 6C, first, after the wafer W is loaded in the vacuum processing chamber 2 and mounted on the mounting table 3, the shielding plate 5 moves while changing its relative location with respect to the ICP source 4 so that the through hole 11 in the shielding plate 5 is set to face a first desired location (a first location where the angled etching is to be performed on the wafer surface).

Subsequently, the processing gas is supplied from the processing gas supply unit into the vacuum processing chamber 2, RF power is applied to the coil 8 and the mounting table 3, and the ions are generated by the ICP source 4. The ions are diffused and a part of the ions pass through the through hole 11 in the shielding plate 5 to reach the first desired location. The ions etch the wafer surface along the diffusing direction, and a trench 13*i* whose inclined angle conforms to the diffusing direction is formed at the first desired location (FIG. 6A).

Thereafter, when the depth of the trench 13*i* comes up to a predetermined depth, an application of RF power to the coil 8 and mounting table 3 is stopped. Then, the shielding plate 5 moves while changing its relative location with respect to the ICP source 4 so that the through hole 11 in the shielding plate 5 is set to face a second desired location (a location where the angled etching is desired to be performed subsequently) on the wafer surface.

Subsequently, a trench 13*j* whose inclined angle conforms to the diffusing direction of the ions is formed at the second desired location by supplying the same processing gas as described above and generating the ions. In this case, since the locational relationship between the ICP source 4 (the ion-generating region 12) and the through hole 11 in the shielding plate 5 while forming the trench 13*j* is different from the locational relationship therebetween while forming the trench 13*i*, the diffusing direction of the part of the ions passing through the through hole 11 while forming the trench 13*j* is different from the diffusing direction of the part of the ions passing through the through hole 11 while forming the trench 13*i*. As a result, the inclined angle of the trench 13*j* is different from that of the trench 13*i* (FIG. 6B).

Thereafter, when the depth of the trench 13*j* comes up to a predetermined depth, the application of RF power to the coil 8 and mounting table 3 is stopped. Also, the shielding plate 5 moves while changing its relative location with respect to the ICP source 4 so that the through hole 11 in the shielding plate 5 is set to face a third desired location (again, a location where the angled etching is to be performed subsequently) on the wafer surface.

Subsequently, a trench 13k whose inclined angle conforms to the diffusing direction of the ions is formed at the third desired location by supplying the same processing gas as described above and generating the ions. In this case, since the locational relationship between the ICP source 4 (the ion-generating region 12) and the through hole 11 in the shielding plate 5 while forming the trench 13k is different from a locational relationship while forming the trenches 13i and 13j, the diffusing direction of a part of the ions passing through the through hole 11 while forming the trench 13k is different from the diffusing direction of a part of the ions passing through the through hole 11 while forming the trenches 13i and 13j. As a result, the inclined angle of the trench 13k is different from those of the trenches 13i and 13j (FIG. 6C).

Thereafter, the present process is completed when a desired number of the trenches are formed by repeating the same operations.

In accordance with the angled etching processing of FIGS. 6A to 6C, since the shielding plate 5 moves while changing its relative location with respect to the ICP source 4, it is possible to make the ions having distinct diffusing directions reach a plurality of locations (the first desired location, the second desired location and the third desired location) on the wafer surface. Thus, the trenches 13i, 13j and 13k each of which has a distinct inclined angle can be formed at the plurality of locations on the wafer surface.

Hereinafter, a fourth preferred embodiment of the present invention will be explained.

The fourth preferred embodiment has basically the same configuration and operation of the above-described first preferred embodiment, except that the ICP source 4 moves while changing its relative location with respect to the shielding plate 5. Therefore, the explanation of the configuration of the substrate processing apparatus will be omitted herein, and operations different from the first preferred embodiment will be explained below.

Figure 7A:
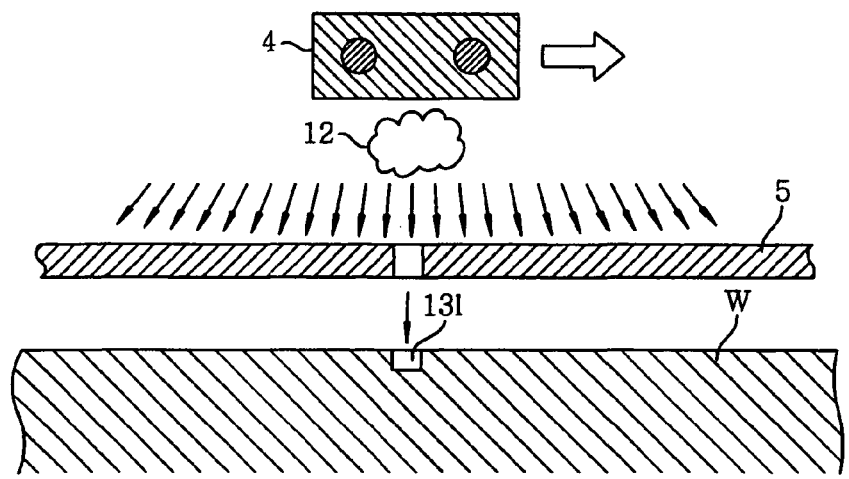
FIGS. 7A to 7C present process charts of the angled etching processing performed by the etching processing apparatus as a substrate processing apparatus in accordance with a fourth preferred embodiment.
Figure 7B:
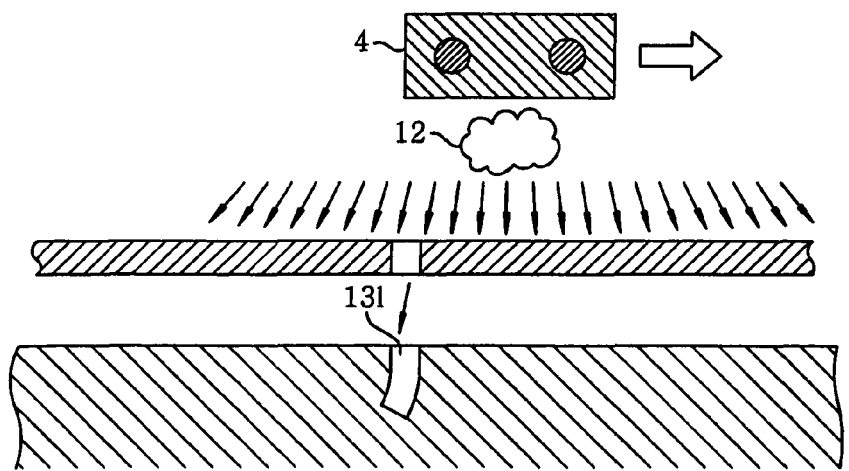
Figure 7C:
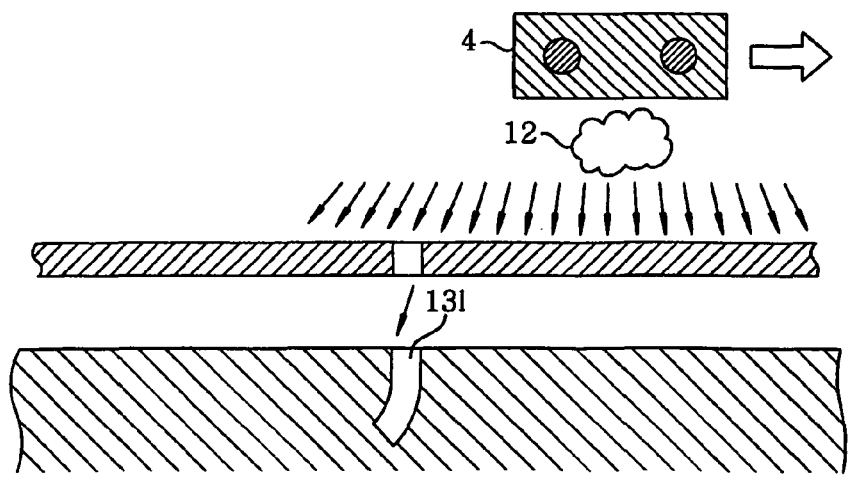

FIGS. 7A to 7C present process charts of the angled etching processing performed by the etching processing apparatus as a substrate processing apparatus in accordance with the preferred embodiment. This angled etching processing is also performed by the computer connected to the etching processing apparatus 1 according to a program corresponding to the etching processing.

In FIGS. 7A to 7C, first, after the wafer W is loaded in the vacuum processing chamber 2 and mounted on the mounting table 3, the shielding plate 5 is moved so that the through hole 11 in the shielding plate 5 is placed right below the ICP source 4 and the shielding plate 5 is placed parallel to the wafer surface.

Subsequently, the processing gas is supplied from the processing gas supply unit into the vacuum processing chamber 2, RF power is applied to the coil 8 and the mounting table 3, and the ions are generated by the ICP source 4. The ions are diffused and a part of the ions pass through the through hole 11 in the shielding plate 5 to be introduced to the wafer surface. In this case, since the through hole 11 in the shielding plate 5 is opened right below the ICP source 4, the diffusing direction of the ions passing through the through hole 11 is vertical to the shielding plate 5 and the ions etches the wafer surface vertically to form a trench 13l (FIG. 7A).

Subsequently, when the depth of the trench 13l comes up to a predetermined depth, the ICP source 4 moves a predetermined distance along an arrow of FIG. 7B with respect to the shielding plate 5. In this case, since the shielding plate 5 has not moved, the through hole 11 remains facing the trench 13l. However, since the ICP source 4 has moved with respect to the through hole 11, the diffusing direction of the ions passing through the through hole 11 is inclined to the above-described diffusing direction in FIG. 7A. Therefore, the ions passing through the through hole 11 are introduced obliquely to the trench 13l, thereby forming the trench 13l which is etched obliquely with respect to the wafer surface (FIG. 7B).

Subsequently, when the depth of the trench 13l comes up to a predetermined depth, the ICP source 4 again moves a predetermined distance along a arrow of FIG. 7C with respect to the shielding plate 5. In this case, since the shielding plate 5 has not moved, the through hole 11 remains facing the trench 13l. However, the diffusing direction of the ions passing the through hole 11 is inclined to the above-described diffusing direction in FIG. 7B. Therefore, the ions passing through hole 11 are introduced to the trench 13l more obliquely than the ions of the above-described FIG. 7B, and the trench 13l is formed more obliquely on the wafer surface.

Thereafter, when the depth of the trench 13l comes up to a predetermined depth, the present processing is stopped. In this case, the inclined angle of the formed trench 13l varies in the middle of the trench along its depth direction.

In accordance with the above-described angled etching apparatus of FIGS. 7A to 7C, since the ICP source 4 moves while changing its relative location with respect to the shielding plate 5, when the plasma is introduced to the wafer surface, it is possible to change the diffusing direction of the plasma being introduced thereto. Therefore, the trench 13l whose inclined angle varies in the middle thereof along its depth direction can be formed.

Furthermore, although the explanation has been given as to a case where the wafer to be processed is a wafer used for a semiconductor device in the preferred embodiment described above, the substrate to be processed is not limited thereto and may also be a glass substrate of, e.g., an LCD (Liquid Crystal Display) or an FPD (Flat Panel Display).

Moreover, in the above-described substrate processing apparatus of each preferred embodiment, the ICP source is used as the plasma source. However, any plasma source that diffuses ions can be used for the substrate processing apparatus of the present invention.

Furthermore, in the above-described substrate processing apparatus of each preferred embodiment, the application time of RF power to the coil 8 and mounting table 3, and the velocity of the ICP source 4 and the shielding plate 5 may be set according to the type of the processing gas and the type of a layer on the wafer surface where the RIE is performed. With this configuration, the throughput can be maintained appropriately regardless of the type of the processing gas, etc.

The object of the invention can also be achieved by providing a storage medium storing a program code of a software realizing a function of each above-described preferred embodiment to a computer so that the CPU of the computer reads out the program code stored in the storage medium to execute it.

In this case, since the functions of each preferred embodiment are implemented by the program code read out from the storage medium, the program code and the storage medium storing the program code also constitute the invention.

In addition, as for the storage medium, any storage medium may be used as long as it can store the program code, namely, a RAM, an NV-RAM, a floppy (registered trade mark) disc, a hard disc, an optical disc, a magneto-optical disc, a CD-ROM, a CD-R, a CD-RW, a DVD (DVD-ROM, DVD-RAM, DVD- RW and DVD+RW), a magnetic tape, a nonvolatile memory card and other kinds of ROM. Otherwise, the program code can be downloaded from other computers, databases or the like (not shown) connected to the internet, a commercial network, a local area network, or the like.

Still further, although the functions of each preferred embodiment can be implemented in a manner that the computer or the like reads out to perform the program code, the functions of the preferred embodiment can also be implemented in a manner that an operating system (OS) or the like in the computer performs all or a part of processes for performing the program code in response to a command of the program code, wherein the functions of each above-described preferred embodiment are implemented by the processes for performing the program code.

Furthermore, the functions of each above-described preferred embodiment can also be implemented in a manner that the program code read out from the storage medium is stored in a memory included in a function extension board inserted in the computer or a function extension unit connected to the computer, and, in response to commands of the program code, a CPU or the like included in the function extension board or the function extension unit performs all or a part of the processes for performing the program code, wherein the functions of each above-described preferred embodiment are implemented by the processes for performing the program code.

The form of the program code may be an object code, a program code performed by using an interpreter, script data supplied to an OS, or so forth.

While the invention has been shown and described with respect to the preferred embodiments, it will be understood by those skilled in the art that various changes and modifications may be made without departing from the scope of the invention as defined in the following claims.

What is claimed is:

1. A substrate processing apparatus for performing plasma etching, comprising:
   a plasma source which generates ions by converting a process gas into a plasma;
   a mounting table for mounting thereon a substrate to be processed; and
   a shielding member placed between the substrate mounted on the mounting table and the plasma source, wherein the generated ions by the plasma source are radially propagated from the plasma source and the shielding member has a through-hole through which a part of the radially propagated ions passes,
   wherein the plasma source and the shielding member are allowed to move parallel to a top surface of the substrate mounted on the mounting table as a single unit.

2. The substrate processing apparatus of claim 1, wherein the through-hole is opened at a region other than a region allowing the ions passing through the through-hole to be vertically incident on a surface of the substrate mounted on the mounting table.

3. The substrate processing apparatus of claim 1, wherein the shielding member is electrically floated.

4. The substrate processing apparatus of claim 3, wherein the shielding member is a conductor.

5. A substrate processing method for performing a plasma processing on a substrate in a substrate processing apparatus, the method comprising providing the substrate processing apparatus as recited in claim 1, and further comprising:
   diffusing a plasma radially by the plasma source; and
   moving the plasma source and the shielding member parallel to a top surface of the substrate as a single unit.

6. The substrate processing apparatus of claim 1, further comprising a controller configured to place the shielding plate between the substrate and the plasma source after the substrate is mounted on the mounting table or from an initial stage.

7. The substrate processing apparatus of claim 1, further comprising a controller configured to cut a power to the plasma source and the mounting table when the plasma source and the shielding plate move.

8. The substrate processing apparatus of claim 1, wherein the plasma source is positioned at a location spaced about 40 mm above the substrate mounted on the mounting table.

9. The substrate processing apparatus of claim 1, wherein the shielding member is positioned at a location spaced from the substrate mounted on the mounting table by 10 mm to 20 mm.

* * * * *